(12) United States Patent
Hellmund et al.

(10) Patent No.: US 8,025,783 B2
(45) Date of Patent: Sep. 27, 2011

(54) METHOD FOR PRODUCING A COMPOSITE MATERIAL, ASSOCIATED COMPOSITE MATERIAL AND ASSOCIATED SEMICONDUCTOR CIRCUIT ARRANGEMENTS

(75) Inventors: Oliver Hellmund, Feldkirchen (DE); Daniel Kraft, Klagenfurt-Viktring (AT); Friedrich Kroener, Villach (AT); Francisco Javier Santos Rodriguez, Villach (AT); Carsten Von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1035 days.

(21) Appl. No.: 11/855,506

(22) Filed: Sep. 14, 2007

(65) Prior Publication Data

US 2008/0067630 A1  Mar. 20, 2008

(30) Foreign Application Priority Data

Sep. 14, 2006  (DE) .......................... 10 2006 043 163

(51) Int. Cl.
*C25D 15/00* (2006.01)

(52) U.S. Cl. ....................................................... 205/109

(58) Field of Classification Search ......................... None
See application file for complete search history.

(56) References Cited

U.S. PATENT DOCUMENTS

| | | | | |
|---|---|---|---|---|
| 3,929,590 A * | 12/1975 | Heyes | ........................... | 205/183 |
| 4,132,828 A | 1/1979 | Nakamura et al. | | |
| 4,526,841 A * | 7/1985 | Yamatsuta et al. | ............ | 428/614 |
| 4,613,388 A * | 9/1986 | Walter et al. | .................. | 148/425 |
| 6,238,454 B1* | 5/2001 | Polese et al. | .................... | 75/243 |
| 2003/0024611 A1 | 2/2003 | Cornie et al. | | |
| 2004/0066610 A1* | 4/2004 | Miyachi et al. | | |
| 2004/0203235 A1* | 10/2004 | Miyakawa | | |
| 2004/0266065 A1* | 12/2004 | Zhang et al. | | |
| 2006/0091557 A1* | 5/2006 | Sakamoto et al. | | |
| 2006/0290000 A1* | 12/2006 | Worwag et al. | ............... | 257/768 |

FOREIGN PATENT DOCUMENTS

DE  100 15 962 C2 *  4/2002
EP  1 055 650 A1   11/2000

* cited by examiner

*Primary Examiner* — Harry D Wilkins, III
(74) *Attorney, Agent, or Firm* — Slater & Matsil, L.L.P.

(57) ABSTRACT

A method for producing a composite material, associated composite material and associated semiconductor circuit arrangements is disclosed. A plurality of first electrically conducting material particles are applied to a carrier substrate and a second electrically conducting material is galvanically deposited on a surface of the first material particles in such a way that the second material mechanically and electrically bonds the plurality of first material particles to one another.

28 Claims, 5 Drawing Sheets

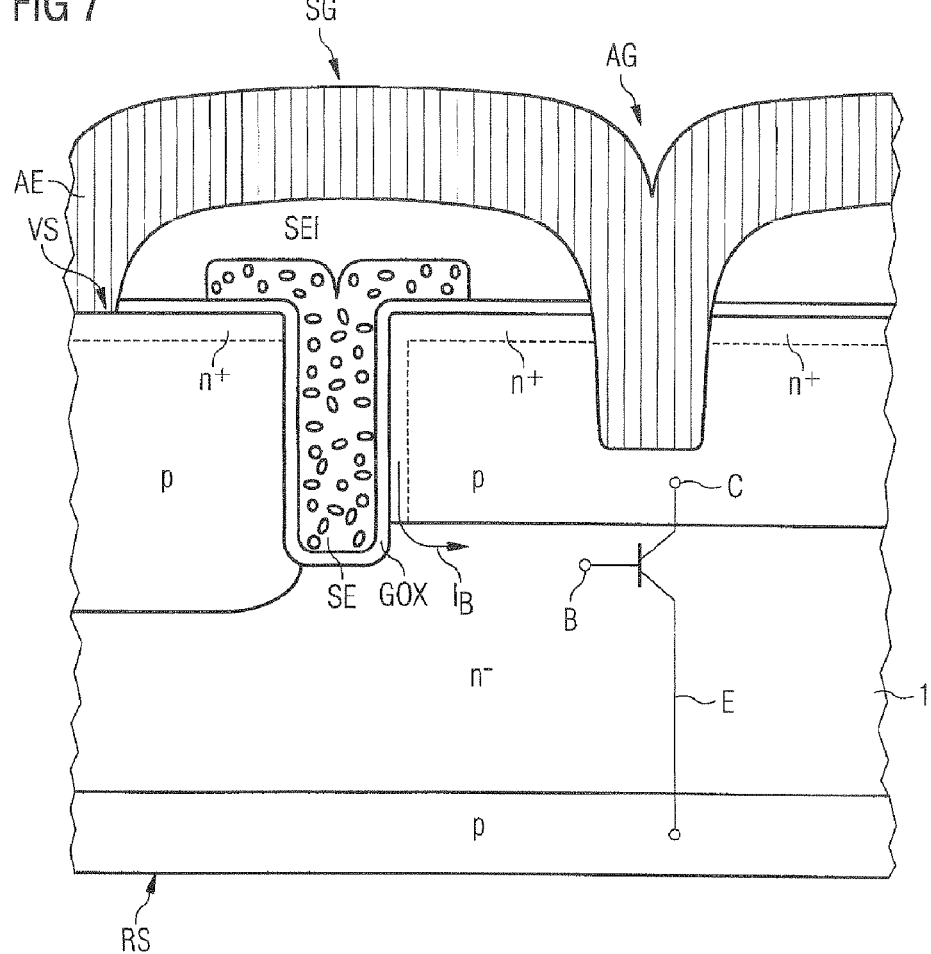

METHOD FOR PRODUCING A COMPOSITE MATERIAL, ASSOCIATED COMPOSITE MATERIAL AND ASSOCIATED SEMICONDUCTOR CIRCUIT ARRANGEMENTS

This application claims priority to German Patent Application 10 2006 043 163.4, which was filed Sep. 14, 2006, and is incorporated herein by reference.

TECHNICAL FIELD

The present invention relates to a method for producing a composite material, an associated composite material and associated semiconductor circuit arrangements and, in particular, to a galvanically formed composite material.

BACKGROUND

In semiconductor technology it is often necessary for electrically conducting layers with a thickness greater than 100 micrometers to be formed and/or for depressions, holes or trenches likewise with a depth of greater than 100 micrometers to be filled. This kind of production of thick electrically conducting layers and/or filling of corresponding depressions is usually carried out by galvanic depositing processes. However, this naturally requires a very considerable amount of time to be spent.

Furthermore, it is also possible to provide what are known as solder depots in the form of small solid plates (known as preforms). Such metal plates often do not by any means provide the conductivity properties desired for many applications, in particular whenever it is intended to balance out very different coefficients of thermal expansion of the chip and the substrate.

Furthermore, it is known to apply precious metal pastes by the screen printing process, whereby layers likewise up to 50 micrometers thick can be formed, or depressions up to 50 micrometers deep can be filled.

There is therefore a need to provide a method for producing a composite material, an associated composite material and associated semiconductor arrangements, allowing layer thicknesses greater than 100 μm to be realized with improved properties inexpensively and with minimal expenditure of time.

SUMMARY OF THE INVENTION

In the case of an exemplary embodiment, a method for producing a composite material includes preparing a carrier substrate. A plurality of first electrically conducting material particles are applied to the carrier substrate. A second electrically conducting material is galvanically deposited on a surface of the first material particles for bonding the plurality of first material particles and for producing the composite material.

In one embodiment, the composite material includes a plurality of first electrically conducting material particles and a second electrically conducting material, which is galvanically deposited on a surface of the first material particles in such a way that it mechanically and electrically connects the plurality of first material particles to one another.

An embodiment semiconductor circuit arrangement includes a semiconductor substrate, at least one semiconductor device, which is formed in the semiconductor substrate, an insulating layer, which is formed over the semiconductor substrate, and a depression, which is formed at least in the insulating layer, the depression being filled with the composite material described above.

In the case of an exemplary embodiment, the semiconductor circuit arrangement may comprise a semiconductor substrate, at least one semiconductor device, which is formed in the semiconductor substrate, and a stabilizing layer, which is formed on a back side of the semiconductor substrate, the stabilizing layer comprising the composite material described above.

BRIEF DESCRIPTION OF THE DRAWINGS

Exemplary embodiments of the invention are described in more detail below with reference to the drawings, in which:

FIG. 7 shows a partly enlarged sectional view of a semiconductor device realized in FIG. 6.

DETAILED DESCRIPTION OF ILLUSTRATIVE EMBODIMENTS

Figure 1:
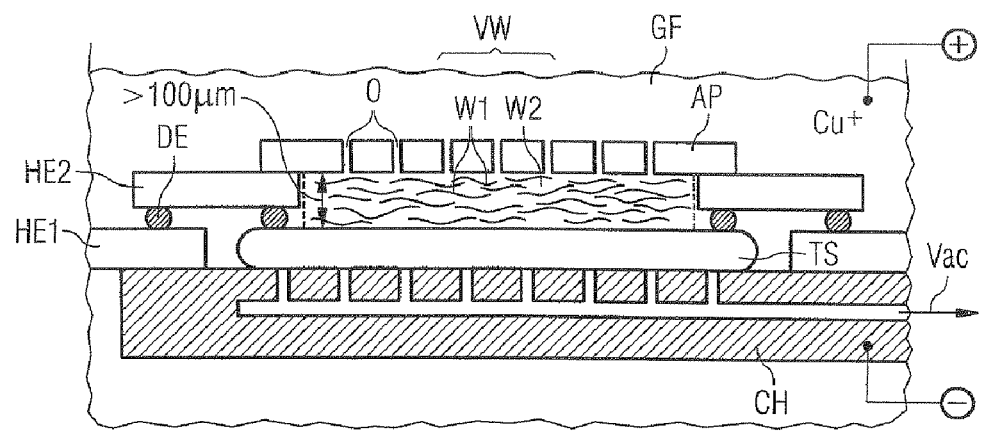
FIG. 1 shows a simplified sectional view of a device for carrying out a method according to an exemplary embodiment.

According to one embodiment of the present invention, the time taken to produce composite material is significantly reduced by applying a plurality of first material particles to a carrier substrate and subsequently galvanically depositing a second electrically conducting material on a surface of the first material particles for bonding the plurality of first material particles and for producing the composite material. Furthermore, previously not possible layer thicknesses can be produced or depressions cost-effectively filled. In particular, however, such a method can be realized very well in semiconductor technology, since neither high temperatures nor high pressures are necessary to achieve the resultant layers.

In the case of an exemplary embodiment, the first material particles have a diameter which is greater than 1 micrometer. For example, grains, beads or fibers with a diameter of greater than 1 micrometer are applied as the first material particles, whereby the extremely high layer thicknesses greater than 100 micrometers can be quickly and easily realized. In an exemplary embodiment, the diameters of the fibers are about 1 μm, while the diameters of the grains or beads are about 10 μm. Both metallic materials and carbon, and in particular carbon fibers, can be used as the first material particles. In particular, when a metallic material, such as for example copper, is used as the second material, a thermal behavior that is very similar to that of semiconductor materials, and in particular silicon, is obtained for the composite material consisting of carbon fibers and copper, whereby stabilizing layers that have coefficients of thermal expansion very similar to that of a semiconductor material used, but electrical conductivities of a metal, can be realized. The carrier substrate in this embodiment comprises a semiconductor substrate and in particular an Si semiconductor substrate.

In the case of an exemplary embodiment, the first material particles may have a diameter of less than 10 micrometers.

For the production method, after applying the first material particles, a pressing plate, for example, may press the first material particles on the carrier substrate, the pressing plate having openings which allow a galvanic fluid used in the galvanic deposition to pass through but do not allow the first material particles to pass through.

The carrier substrate may, for example, comprise an insulating layer with depressions, on the surface of which a seed layer is formed. In this way, contacts can also be produced quickly and inexpensively.

The voids existing between the first material particles may, for example, only be partially filled, whereby both the time required and the costs can be reduced significantly. However, the voids existing between the first material particles may also be completely filled with the second material, whereby a mechanically particularly stable composite material is obtained.

When a semiconductor circuit arrangement with a depression that is formed at least in an insulating layer is realized, it is accordingly possible to produce quickly and inexpensively not only contacts with respect to the semiconductor devices realized in the semiconductor substrate but also stabilizing filler layers of material resistant to shearing stress that significantly reduce wafer rupture.

Alternatively, however, it is also possible to produce a semiconductor circuit arrangement with a full-area stabilizing layer of the composite material according to exemplary embodiments of the present invention, whereby significantly simplified handling is obtained, in particular for ultra-thin semiconductor wafers, and once again wafer rupture is reduced.

Some exemplary embodiments of the invention are represented below on the basis of figures, which serve merely the purpose of illustration and do not restrict the scope of the invention.

FIG. 1 shows a simplified sectional view of a device for carrying out a method according to an exemplary embodiment for producing a composite material.

According to FIG. 1, a carrier substrate TS may be held, for example, by a holding device, such as for example a vacuum chuck CH. Here, the vacuum chuck CH has channels that suck the carrier substrate TS onto them and securely hold it on the surface of the chuck CH when a negative pressure or vacuum (Vac) is applied. Furthermore, the device has lateral holding elements HE1, which prevent lateral slipping of the carrier substrate TS. The carrier substrate TS may comprise, for example, a semiconductor wafer which is unprocessed, partly processed or completely processed. Here, the semiconductor wafer may be, for example, a silicon semiconductor wafer.

The device according to FIG. 1 may also have a second holding element HE2, which is pressed both onto the first holding element HE1 and onto the carrier substrate TS by means of sealing elements DE, such as for example an O-ring.

After this preparation of the carrier substrate TS, a plurality of first electrically conducting material particles W1 are then applied to the carrier substrate TS. For example, electrically conducting fibers, and in particular carbon fibers, may be applied to the carrier substrate TS as the first electrically conducting material particles W1. In the case of an exemplary embodiment, the first material particles W1 are applied in such a way that they lie loosely one on top of the other and are not bonded to one another or firmly anchored.

In the case of an exemplary embodiment, however, electrically conducting grains or beads can also be applied to the carrier substrate TS and between the second holding elements HE2. In the case of an exemplary embodiment, in addition to the carbon material used by way of example, metallic material, and in particular copper, can likewise be used for the first material particles W1.

To realize the desired thick layers of greater than 100 micrometers, the first material particles W1 have, for example, a diameter greater than 1 micrometer.

Optionally, a pressing plate AP with openings O may be placed on the surface of the first material particles W1, reliably preventing the first material particles W1 from floating away or becoming dispersed in a subsequently added galvanic fluid GF. The openings O in the pressing plate AP are dimensioned here in such a way that they adequately allow a galvanic fluid GF that is respectively used to pass through and adequately do not allow the first material particles W1 that are respectively used to pass through.

Subsequently, the entire device or only the carrier substrate TS with the first material particles W1 lying on it is placed in an electroplating bath with a galvanic fluid GF and an electroplating operation is carried out. For example, the galvanic fluid GF comprises copper ions Cu+, whereby a copper layer is formed as a second material W2 on the surface of the first material particles W1 for bonding the plurality of first material particles W1 and for producing a stabilizing layer of great thickness (greater than 100 micrometers) on the surface of the carrier substrate TS.

Depending on the requirement, here a void that is formed between the first material particles W1 may be filled either only partially or completely with the second material W2. In this way, either the desired composite material VW is obtained very quickly and inexpensively or else a mechanically extremely stable composite material VW, which is suitable in particular as a stabilizing layer for ultra-thin semiconductor wafers or carrier substrates TS, is obtained.

In particular, when carbon fibers are used as the first material particles W1 and copper is used as the second material W2, a carbon-fiber-reinforced metal (CFRM) is obtained as the composite material VW, scarcely differing in terms of its coefficient of thermal expansion from the coefficient of thermal expansion of silicon and being very stable in terms of its mechanical strength, but coming very close to copper in terms of its electrical conductivity.

In addition, according to the present method, layers 100 to 200 micrometers thick can be realized in an extremely short time. Conventional galvanic depositing processes have in comparison very high process times of typically 1 micrometer/min and are consequently not cost-effective.

The carbon fibers are, for example, oriented substantially parallel to the surface of the carrier substrate TS, whereby a particularly stable composite material VW can be realized. In particular, interwoven carbon fiber structures can be used.

Furthermore, a seed layer (not represented) may be formed between the composite material VW and the carrier substrate TS, further simplifying the production of the composite material VW. Materials that can be given by way of example for such a seed layer are Ni, Ti, and TiN. In this case, the seed layer additionally acts as a diffusion barrier layer with respect to the copper used as the second material W2.

Figure 2:
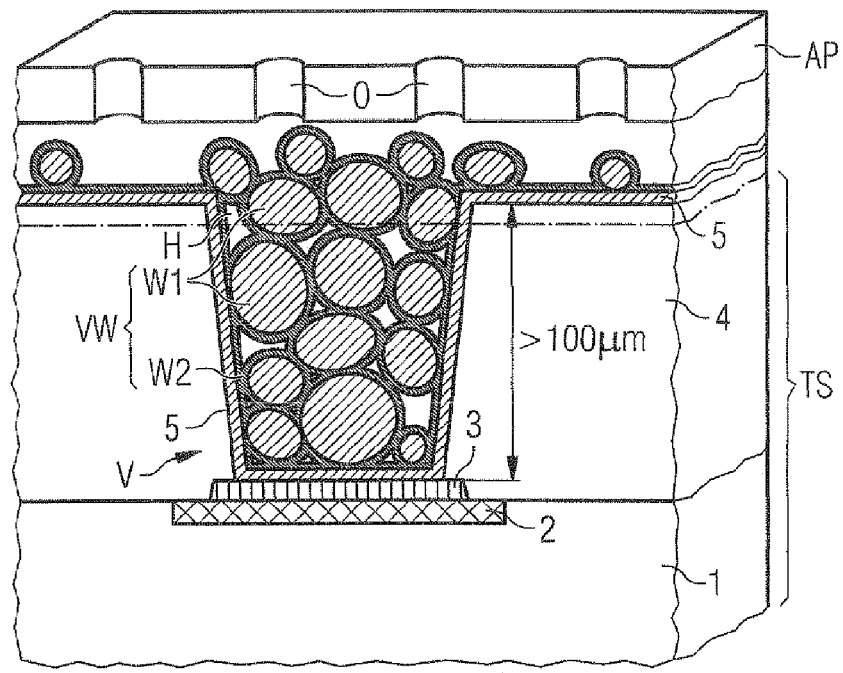
FIG. 2 shows a simplified sectional view of a semiconductor circuit arrangement with composite material according to the invention according to an exemplary embodiment.
Figure 3:
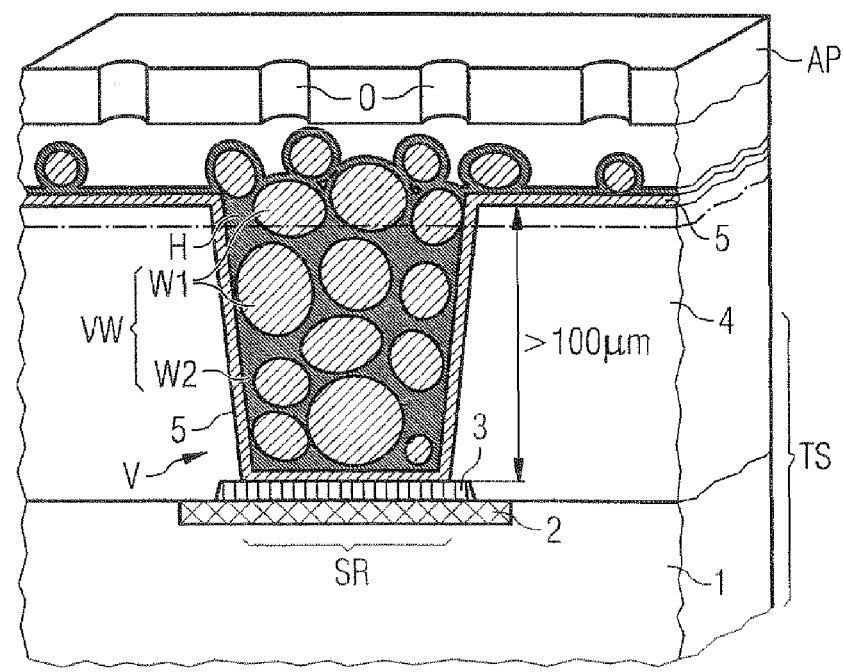
FIG. 3 shows a simplified sectional view of a semiconductor circuit arrangement with a composite material according to an exemplary embodiment.

FIGS. 2 and 3 show simplified sectional views to illustrate a semiconductor circuit arrangement in which the aforementioned composite material VW serves as a contact with respect to a semiconductor device formed in a semiconductor substrate.

According to FIG. 2, the carrier substrate TS may comprise a semiconductor substrate 1, such as for example a single-crystal Si semiconductor substrate, in which at least one semiconductor device 2 or a semiconductor circuit is formed. On a surface of the semiconductor device 2 there may be formed, for example, a contact terminal area or contact pad 3 of an electrically conducting material, such as for example aluminum.

On the surface of the semiconductor substrate 1 there may also be formed a thick insulating layer 4, which is greater than 100 micrometers thick. Furthermore, on the contact terminal areas 3 in the insulating layer 4 there may also be formed contact holes or depressions V, which are then to be filled with the composite material according to exemplary embodiments.

Here there may once again be formed on the surface of the contact terminal areas 3 and the depression V or the insulating layer 4 a seed layer 5, which for example comprises Ni, Ti or TiN.

As already described above, first material particles W1 are subsequently applied, for example over the full surface area, on the surface of the carrier substrate TS. In the case of an exemplary embodiment, the first material particles W1 also completely fill the depression V, with the exception of the voids formed between the first material particles W1. The first material particles W1 may take the form here, for example, of copper grains or beads, since they can be filled more easily into the depressions V configured as contact holes than the aforementioned fibers, and in particular carbon fibers.

In the case of an exemplary embodiment, the number of the first material particles W1 in a depression V may be 1000 or more. In the case of an exemplary embodiment, the number of the first material particles W1 may distinctly exceed 1,000 and be, for example, more than 100,000. In the case of an exemplary embodiment, the number of voids formed between the first material particles W1 may be greater than 1,000. In the case of an exemplary embodiment, the number of voids formed is distinctly greater than 10,000, for example greater than 100,000.

Subsequently, it is once again optionally possible for the pressing plate AP to press the first material particles W1 on the carrier substrate TS, but it is also possible in principle to dispense with it.

The carrier substrate TS is then once again immersed in an electroplating bath or in a galvanic fluid GF and a galvanic deposition of electrically conducting material, as the second material, is carried out on the surface of the first material particles W1. For example, copper is galvanically deposited as the second material W2, the voids H that are present between the first material particles W1 only being partially filled. For this case there is the semiconductor circuit arrangement represented in FIG. 2, which can fill depressions with a depth greater than 100 micrometers very quickly and inexpensively and is therefore particularly suitable for contact holes or their contacts.

Alternatively, however, according to FIG. 3, the void H existing between the first material particles W1 may also be completely filled with the second material W2, whereby a composite material VW that is much more compact and in particular improved in terms of mechanical stability is obtained.

Although a composite material VW produced in this way is also once again suitable as a contact, it also serves in particular as a stabilizing filler layer and in particular as a material that is resistant to shearing stress, as can be formed in isolation trenches of what are known as sawing frames.

Figure 4:
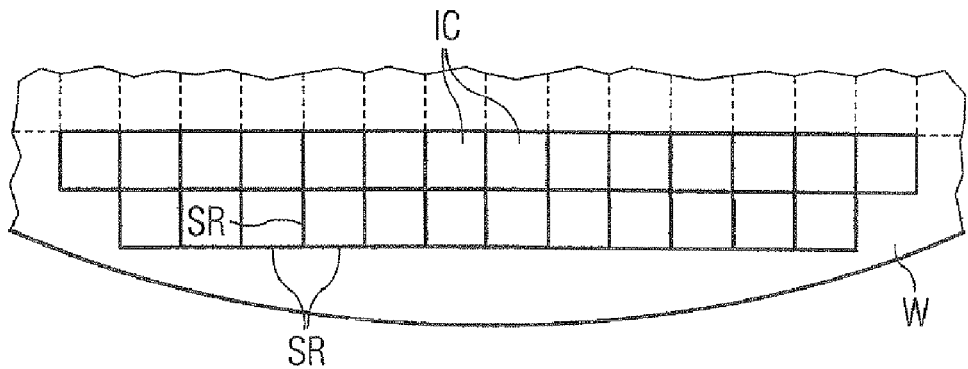
FIG. 4 shows a simplified plan view of a semiconductor wafer to illustrate the case of an application given by way of example.

FIG. 4 shows a partial plan view of a disk-shaped article, as may be encountered in particular as an ultra-thin semiconductor wafer W according to the present invention.

According to FIG. 4, the ultra-thin semiconductor wafer W comprises a plurality of integrated semiconductor circuits or semiconductor chips IC, which are spaced apart from one another by sawing or scoring frames SR lying in between. Since such a wafer is usually deposited in a rack, extremely high mechanical stresses may occur at a depositing point and may lead to a crack (not represented) in the semiconductor wafer W. This crack can possibly spread through the entire wafer W and finally lead to a wafer rupture.

Figure 5:
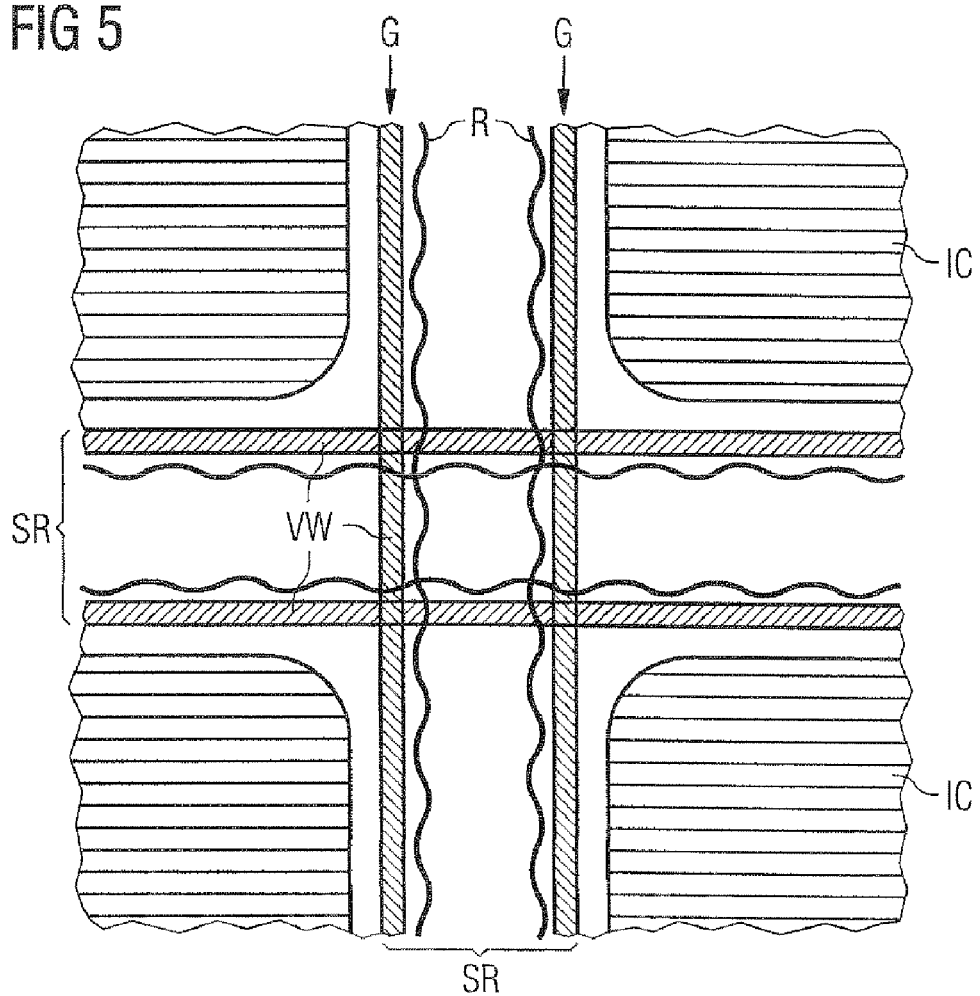
FIG. 5 shows a simplified enlarged partial view of FIG. 4.

FIG. 5 shows a partly enlarged view of FIG. 4, the same designations denoting the same or corresponding elements.

According to FIG. 5, two spaced apart trenches or isolation trenches G may then be respectively formed in the sawing frames SR and be filled by one of the processes described above. In the case of an exemplary embodiment, the composite material VW may be filled not only in contact holes but also in the isolation trenches G represented in FIG. 5, whereby the composite material VW acts as a material that is resistant to shearing stress to avoid to wafer rupture as described above. On the one hand, this makes it possible for an occurring hairline crack (not represented), which spreads from an edge of the wafer toward the middle of the wafer, to be reliably stopped. On the other hand, when sawing or cutting the wafer W, it makes it possible for mechanical stresses in the sawing frame region SR to be reliably prevented from spreading along a sawing edge R, whereby once again singulated semiconductor chips or integrated circuits IC can be protected from being damaged.

In the case of an exemplary embodiment, it is also possible for just a single isolation trench G to be formed in the sawing frame SR, with a correspondingly greater width, which can once again be quickly and inexpensively filled with the composite material VW, in a way corresponding to the exemplary embodiments described above.

Apart from the materials already described, copper and carbon, for the materials of the composite material, Ag beads or grains may additionally also be electrodeposited in a Cu galvanic process. In principle, other metallic or nonmetallic materials are also conceivable as materials.

Figure 6:
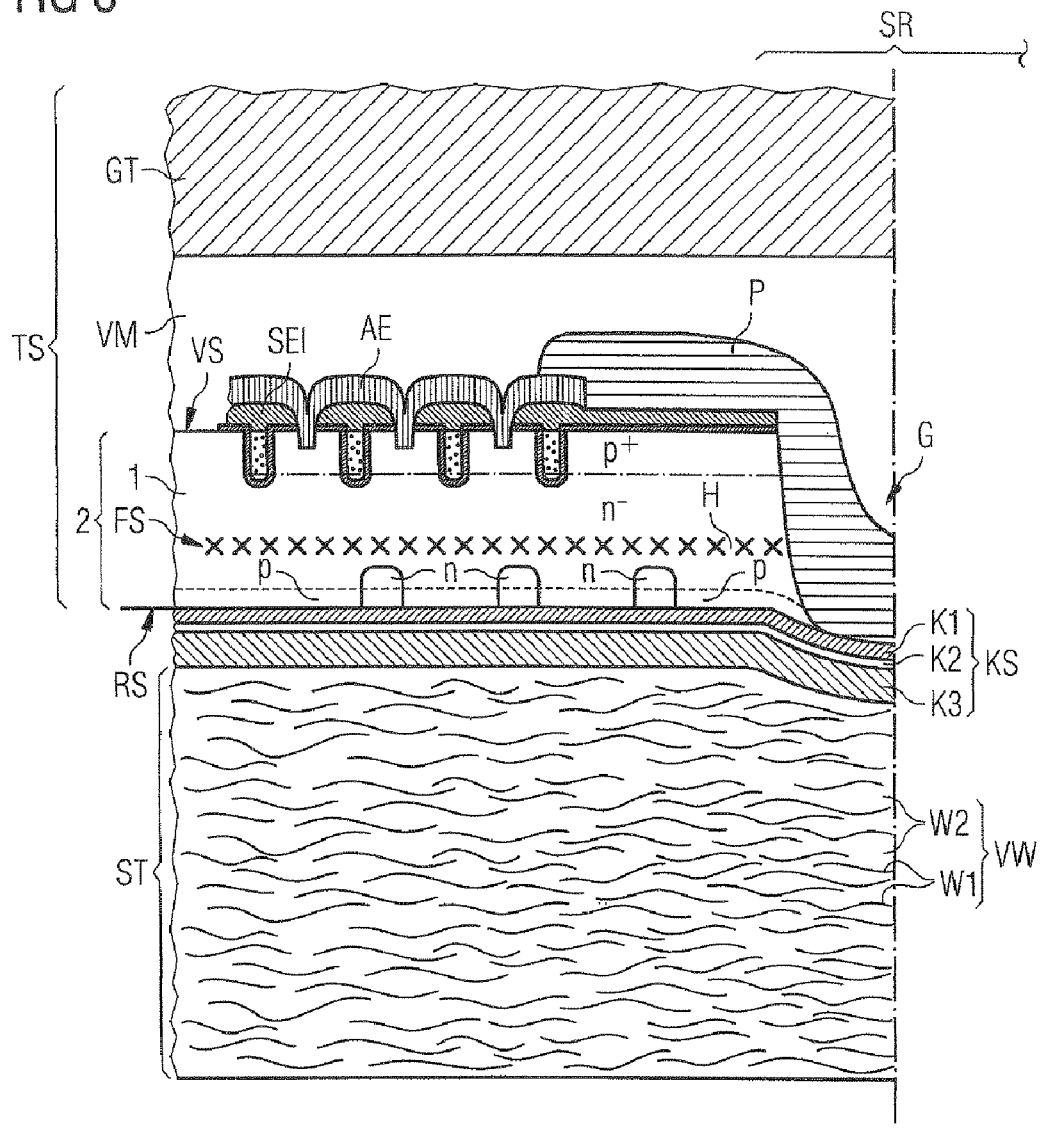
FIG. 6 shows a simplified sectional view of a semiconductor circuit arrangement according to a further exemplary embodiment.

FIG. 6 shows a simplified sectional view of a semiconductor circuit arrangement in which composite material according to a further exemplary embodiment can be used.

The semiconductor circuit according to FIG. 6 relates here to an insulated gate bipolar transistor (IGBT), which is used in power electronics and is capable of switching extremely high currents and also of reliably blocking very high voltages.

In the case of such power semiconductors that are used in particular in power electronics, an adaptation of the coefficient of thermal expansion is of significance in particular, while a high-quality heat sink is also needed to remove the heat that is produced and double-sided processing is required.

The composite material VW described above is suitable for such power semiconductor chips as a stabilizing layer.

FIG. 7 shows a partly enlarged sectional view to illustrate the basic functional mode of such an IGBT.

In a semiconductor substrate 1, a plurality of control trenches SG are formed here on a front side VS and have a gate insulating layer GOX formed on their surface. The control trenches SG are also filled with an electrically conducting material (for example doped polysilicon) to realize a control electrode SE, whereby a vertical field-effect transistor structure is obtained. The semiconductor substrate (body) is, for example, n⁻-doped and has on its back side RS a p-well and on its front side VS n⁺-wells, which are located in a further p-well on the front side.

The control trench SG extends here beyond the p-well on the front side into the n⁻-body of the semiconductor substrate 1. Furthermore, a terminal trench AG is formed in the semiconductor substrate 1 in the region of the n⁺-well, extending beyond the n⁺-well into the p-well but not touching the n⁻-body. The control electrode SE is isolated by a control-electrode insulating layer SEI, the terminal trench AG being filled by a terminal electrode AE of, for example, aluminum. According to FIG. 7, the terminal electrode AE may, for example, be formed over the full area on the surface of the control-electrode insulating layer SEI and the semiconductor substrate 1 and be structured. In this way, a bipolar transistor with a base B, an emitter E and a collector C is obtained, it being possible for the base B to be driven by the field-effect transistor structure (formed by the control electrode SE) or the base current $I_B$. Such power devices have a very high dielectric strength, allowing very high currents to be switched.

Referring back to FIG. 6, once all the front-side structures have been produced in the semiconductor substrate 1, isolation trenches G may also be formed at the locations of the previously described sawing frames SR, for example by a water-jet-guided laser. To passivate the edges, photoimide P may also be additionally formed on the surface and on the sidewalls of the isolation trenches G.

Subsequently, a glass carrier GT, for example, may be attached to the front side VS of the semiconductor substrate 1 by a bonding means VM, such as for example an epoxy resin. This is followed by thinning of the initially unthinned semiconductor substrate 1, until the bottoms of the isolation trenches G appear. Using the isolation trenches G appearing on the back side RS as adjusting marks, a back-side processing of the thinned semiconductor wafer or of the thinned semiconductor substrate 1 can then be carried out. This may be, for example, the implanting of the emitter doping regions, pulsed laser annealing, proton implantation, and the forming of a contact layer structure KS and barrier layers.

The contact layer structure KS may comprise, for example, a multilayer structure, which has an aluminum layer as the first contact layer K1, a Ti layer as the second contact layer K2, and an Au/Sn double layer as the third contact layer K3.

This is followed by forming a full-area stabilizing layer ST, consisting of the composite material VW, in a way corresponding to the exemplary embodiments described above. For example, the carbon fibers, already mentioned above, as the first material particles W1 and copper as the second material W2 are galvanically bonded, thereby producing a stabilizing layer ST that has a coefficient of thermal expansion very similar to the semiconductor substrate 1, which is additionally extremely suitable as a heat sink and also has an extremely high mechanical strength.

Subsequently, the glass carrier GT (and the bonding means VM) can be detached from the front side of the semiconductor substrate 1 and the semiconductor chips already singulated as a result can be bonded by means of diffusion solder. Subsequently, a proton annealing operation can also be carried out, whereby the field stop FS represented in FIG. 6, of for example H atoms, can be realized in the n⁻-body of the semiconductor substrate 1.

After a wafer test, the respective semiconductor chips or integrated circuits IC can be completely singulated, for example by conventional sawing.

In this way, a semiconductor circuit arrangement that can be processed also on its back side in a particularly simple manner, has an extremely high rupture strength and is suitable in particular for power semiconductor devices is obtained.

The invention has been described above with respect to an IGBT. However, it is not restricted to this and also comprises in the same way other semiconductor devices.

What is claimed is:

1. A method for producing a composite material, the method comprising:
   applying a plurality of first electrically conducting material particles to a carrier substrate;
   pressing the first material particles on the carrier substrate using a pressing plate after applying the material particles, wherein the pressing plate has openings, allowing a galvanic fluid used in the galvanic deposition to pass through but not allowing the first material particles to pass through; and
   galvanically depositing a second electrically conducting material on a surface of the first material particles for bonding the plurality of first material particles and for producing the composite material.

2. The method as claimed in claim 1, wherein applying the plurality of first material particles comprises applying grains, beads or fibers to the carrier substrate.

3. The method as claimed in claim 1, wherein the first material particles have a diameter greater than 1 micrometer.

4. The method as claimed in claim 1, wherein the first material particles comprise metallic material.

5. The method as claimed in claim 1, wherein the first material particles comprise carbon fibers.

6. The method as claimed in claim 1, wherein the second material comprises metallic material.

7. The method as claimed in claim 6, wherein the second material comprises copper that is deposited in the galvanic deposition.

8. The method as claimed in claim 1, wherein the carrier substrate comprises a semiconductor substrate.

9. The method as claimed in claim 1, wherein the carrier substrate comprises an insulating layer with depressions, and wherein galvanically depositing comprises forming a seed layer on a surface of the insulating layer.

10. The method as claimed in claim 1, wherein voids between the first material particles are only partially filled by the galvanic deposition.

11. The method as claimed in claim 1, wherein voids between the first material particles are completely filled by the galvanic deposition.

12. A method for manufacturing a composite material, the method comprising:
    applying a plurality of metal particles to a carrier substrate, wherein the carrier substrate comprises an insulating layer with depressions; and
    galvanically depositing an electrically conducting material on a surface of the metal particles, bonding together the plurality of metal particles forming the composite material, wherein galvanically depositing comprises forming a seed layer on a surface of the insulating layer.

13. The method as claimed in claim 12, wherein applying the plurality of metal particles comprises applying grains, beads or fibers to the carrier substrate.

14. The method as claimed in claim 12, wherein the plurality of metal particles have a diameter greater than 1 micrometer.

15. The method as claimed in claim 12, wherein the electrically conducting material comprises metallic material.

16. The method as claimed in claim 15, wherein the electrically conducting material comprises copper that is deposited in the galvanic deposition.

17. The method as claimed in claim 12, wherein the carrier substrate comprises a semiconductor substrate.

18. The method as claimed in claim 12, wherein voids between the plurality of metal particles are only partially filled by the galvanic deposition.

19. The method as claimed in claim 12, wherein voids between the plurality of metal particles are completely filled by the galvanic deposition.

20. The method as claimed in claim 12, further comprising pressing the plurality of metal particles on the carrier substrate using a pressing plate after applying the plurality of metal particles.

21. The method as claimed in claim 20, wherein the pressing plate comprises openings, which allow a galvanic fluid used in the galvanic deposition to pass through but do not allow the plurality of metal particles to pass through.

22. A method of manufacturing a semiconductor device, the method comprising:
    forming a trench in a substrate;
    forming a seed layer on sidewalls of the trench;
    filling the trench with a plurality of first electrically conducting material particles; and
    galvanically filling a second electrically conducting material in the trench, wherein the second electrically conducting material and first electrically conducting material particles form a composite material.

23. The method as claimed in claim 22, wherein forming the trench in a substrate comprises forming a trench in a material layer over the substrate.

24. The method as claimed in claim 22, wherein the trench comprises a depth greater than 100 μm.

25. The method as claimed in claim 22, wherein the first material particles are metallic.

26. The method as claimed in claim 22, further comprising pressing the first material particles in the trench using a pressing plate.

27. The method as claimed in claim 22, wherein the semiconductor device is an insulated gate bipolar transistor (IGBT).

28. A method for manufacturing a composite material, the method comprising:
    applying a plurality of metal particles to a carrier substrate;
    galvanically depositing an electrically conducting material on a surface of the metal particles, bonding together the plurality of metal particles forming the composite material; and
    pressing the plurality of metal particles on the carrier substrate using a pressing plate after applying the plurality of metal particles, wherein the pressing plate comprises openings, which allow a galvanic fluid used in the galvanic deposition to pass through but do not allow the plurality of metal particles to pass through.

* * * * *